(12) United States Patent
Li et al.

(10) Patent No.: US 6,908,824 B2
(45) Date of Patent: Jun. 21, 2005

(54) SELF-ALIGNED LATERAL HETEROJUNCTION BIPOLAR TRANSISTOR

(75) Inventors: Jian Xun Li, Singapore (SG); Lap Chan, Singapore (SG); Purakh Raj Verma, Singapore (SG); Jia Zhen Zheng, Singapore (SG); Shao-fu Sanford Chu, Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 0 days.

(21) Appl. No.: 10/703,284

(22) Filed: Nov. 6, 2003

(65) Prior Publication Data

US 2005/0101096 A1 May 12, 2005

(51) Int. Cl.[7] .............................................. H01L 21/331
(52) U.S. Cl. ...................... 438/309; 438/316; 438/312; 438/313
(58) Field of Search .......................... 438/309, 312–314, 438/316; 257/122, 197, 183, 127, 125, 129, 141, 162, 165, 170, 198

(56) References Cited

U.S. PATENT DOCUMENTS

2003/0011001 A1 * 1/2003 Chevalier et al. ........... 257/197

2003/0025125 A1 * 2/2003 Menut et al. ............... 257/141

* cited by examiner

Primary Examiner—Hoai Pham
Assistant Examiner—Nathan W. Ha
(74) Attorney, Agent, or Firm—Mikio Ishimaru

(57) ABSTRACT

A method for manufacturing a lateral heterojunction bipolar transistor (HBT) is provided comprising a semiconductor substrate having a first insulating layer over the semiconductor substrate. A base trench is formed in a first silicon layer over the first insulating layer to form a collector layer over an exposed portion of the semiconductor substrate and an emitter layer over the first insulating layer. A semiconductive layer is formed on the sidewalls of the base trench to form a collector structure in contact with the collector layer and an emitter structure in contact with the emitter layer. A base structure is formed in the base trench. A plurality of connections is formed through an interlevel dielectric layer to the collector layer, the emitter layer, and the base structure. The base structure preferably is a compound semiconductive material of silicon and at least one of silicon-germanium, silicon-germanium-carbon, and combinations thereof.

10 Claims, 8 Drawing Sheets

SELF-ALIGNED LATERAL HETEROJUNCTION BIPOLAR TRANSISTOR

BACKGROUND

1. Technical Field

The present invention relates generally to semiconductor technology and more specifically to lateral heterojunction bipolar transistors and manufacturing methods therefor.

2. Background Art

A popular device for controllably varying the magnitude of electrical current flowing between two terminals is a three-terminal, a bipolar junction transistor (BJT). The three terminals include a base terminal, a collector terminal, and an emitter terminal. The movement of electrical charge carriers, which produce electrical current flow between the collector and the emitter terminals, varies dependent upon variations in the voltage on the base terminal thereby causing the magnitude of the current to vary. Thus, the voltage across the base and emitter terminals controls the current flow through the emitter and collector terminals.

The terminals of a BJT are connected to their respective base, collector and emitter structures formed in a semiconductor substrate. BJTs comprise two p-n junctions placed back-to-back in close proximity to each other, with one of the regions common to both junctions. There is a first junction between the base and the emitter, and a second junction between the emitter and the collector. This forms either a p-n-p or n-p-n transistor depending upon the characteristics of the semiconductive materials used to form the HBT.

Recently, demand for BJTs has increased significantly because these transistors are capable of operating at higher speeds and driving more current. These characteristics are important for high-speed, high-frequency communication networks such as those required by cell phones and computers.

BJTs can be used to provide linear voltage and current amplification because small variations of the voltage between the base and emitter terminals, and hence the base current, result in large variations of the current and voltage output at the collector terminal. The transistor can also be used as a switch in digital logic and power switching applications. Such BJTs find application in analog and digital circuits and integrated circuits at all frequencies from audio to radio frequency.

Heterojunction bipolar transistors (HBTs) are BJTs where the emitter-base junction is formed from two different semiconductive materials having similar characteristics. One material used in forming the base-emitter junction preferably is a compound semiconductive material such as silicon (Si) and silicon-germanium (SiGe), or silicon-germanium-carbon (SiGeC), or a combination thereof. HBTs using compound semiconductive materials have risen in popularity due to their high-speed and low electrical noise capabilities, coupled with the ability to manufacture them using processing capabilities used in the manufacture of silicon BJTs. Lateral HBTs are HBTs in which the current flow is parallel to the surface of the substrate on which the HBT is manufactured. HBTs have found use in higher-frequency applications such as cell phones, optical fiber, and other high-frequency applications requiring faster switching transistors, such as satellite communication devices.

Most BJTs, including HBTs, in use today are "double poly" bipolar transistors, which use two polysilicon structures; one for an emitter structure, and a second for a base structure of the transistor.

HBTs are manufactured by implanting a silicon substrate with a dopant to provide a collector region. A silicon layer is then grown or formed over the collector region. Insulating dividers called shallow-trench isolations (STIs) are formed in the silicon substrate. The STIs define an intrinsic base region over a portion of the collector region.

Subsequently, a first layer of polysilicon is formed over the silicon substrate and is processed to form a base structure in contact with a portion of the intrinsic base region. One portion of the base structure is formed with an opening in which an emitter structure is subsequently formed.

A first insulating layer is formed over the base structure and is removed in the opening of the base structure over the intrinsic base region by etching down to the intrinsic base region to form an emitter window. The etching process inherently produces a rough surface on the substrate since the etchants used are not particularly selective between the polysilicon layer forming the base structure and the underlying silicon substrate. To get higher performance, compound semiconductive materials such as SiGe and SiGeC generally are grown over the insulating layer and on the rough surface of the substrate. The rough surface causes a major problem because the growth of the compound semiconductive material is irregular and its thickness is not constant as a result of the roughness of the substrate. This leads to performance problems with the device and variations in performance from device to device.

A second layer of polysilicon is deposited into the emitter window and processed to form an emitter structure, which is encircled by and overlaps the base structure. The overlap is necessary to provide room for an emitter contact, but it causes another major problem with unwanted capacitance between the emitter and base structures. This capacitance slows down the operation of the HBT.

A dielectric layer is formed over the emitter structure and is processed to form spacers around the emitter structure. An interlevel dielectric layer (ILD) is then formed over the emitter and base structures.

Finally, contacts are formed in the ILD that connect with the collector, base, and emitter structures. Terminals are then connected to the contacts.

As previously mentioned, the emitter structure overlaps the base structure because it is necessary to provide room for the emitter contact to be formed. Since it is desirable to make the overlap as small as possible, it is desirable to have the emitter structure as small as possible. However, variations in the size of the emitter contact lead to a further major problem causing performance variations in the HBT from device to device.

Although the use of compound semiconductive materials has proven useful in HBTs, once formed by existing methods, this material is subsequently subjected to multiple thermal cycles, implantations and/or etching processes during the formation steps of the remaining elements of the HBT. Such steps include the deposition and etching of oxide layers, nitride layers and subsequently formed polysilicon layers. Several of these processing steps inherently damage the compound semiconductive material. Etching polysilicon over a compound semiconductive layer, for example, adversely affects the compound semiconductive material because the etchants used do not selectively etch only the polysilicon. Some of the compound semiconductive material is also etched during this processing step, resulting in HBTs that are slower and exhibit poor noise performance compared to other HBTs on the same semiconductor wafer.

One attempt to overcome the above-mentioned problems involves selective epitaxial growth of the compound semiconductive material only over the active region of the HBT to form a self-aligned epitaxial intrinsic base structure. Selective epitaxy also may be used in a self-aligned emitter-to-base process in which an emitter window is defined by growing an in situ doped epitaxial lateral over a patterned thin oxide/nitride pad.

In one method for fabricating a self-aligned double-polysilicon HBT using selective epitaxy, the intrinsic base is implanted in the silicon substrate only in the active region of the silicon substrate. A polysilicon layer heavily doped with a dopant of a conductivity type opposite that of the substrate is formed over the active region of the semiconductor substrate having a given conductivity type.

For example, an n-doped silicon substrate would have p -doped polysilicon layers formed thereon. This polysilicon layer then has one or more compound semiconductive 1o layers epitaxially grown over it. These layers are then covered with an upper insulating layer, for example silicon dioxide to form a stack above the active region of the HBT. The polysilicon layers eventually form the extrinsic base structure of the HBT. The stack is then etched to define an emitter window. Electrically insulating regions or "reverse spacers" are separately made on the sidewalls of the emitter window. Next, polysilicon is formed in the is emitter window to form the emitter structure. The emitter structure is thus insulated from the extrinsic base structure by the reverse spacers and by a portion of the upper insulating layer of the stack on which the emitter structure partially rests. This results in a more consistently small-sized emitter structure.

The adverse effects of etching the emitter window persist however. During the operation of etching the stack, over-etching still occurs. The lack of adequate controls and reproducibility of over-etching typically results in the intrinsic base being implanted after formation of the emitter window. Implantation on the over-etched surface does not overcome the problems associated with the over-etched surface.

Furthermore, to improve the operating speed of a HBT, it is important that the base structure be thin enough to minimize the time it takes electronic charges to move from the emitter to the collector, thereby minimizing the response time of the HBT. It is also important, however, that the base structure have a high concentration of dopant in order to minimize base resistance. Typically, ion implantation techniques are used to form a base layer. However, this technique has the problem of ion channeling, which limits the minimum thickness of the base layer. Another disadvantage of ion implantation is that the compound semiconductive layer is often damaged by the ions during implantation.

Additionally, high-temperature annealing typically is required to drive dopants into the various material layers. This annealing step, however, alters the profile of concentration levels of the dopants within the various layers of semiconductive materials forming the transistor to create undesirable dopant profiles within the various material layers.

Existing methods of manufacturing HBTs still have the problems associated with over-etching, the detrimental effects of ion implantation and annealing, and consistency of manufacturability.

Additionally, existing methods of manufacturing HBTs require deep trench isolations and buried layers in the substrate. Deep trench isolations and buried layers use complicated and expensive processing techniques to manufacture.

Solutions to these problems have been long sought but prior developments have not taught or suggested any acceptable solutions and, thus, solutions to these problems have long eluded those skilled in the art.

DISCLOSURE OF THE INVENTION

The present invention provides a lateral heterojunction bipolar transistor (HBT), and a method manufacturing method therefor, comprising a semiconductor substrate. An insulating layer is formed over the semiconductor substrate. A window is formed in the insulating layer exposing a portion of the semiconductor substrate, and a silicon layer is formed over the insulating layer and the window to form a collector layer over the exposed portion of the semiconductor substrate and an emitter layer over the insulating layer. A base trench is etched in the silicon layer over the insulating layer. A silicon spacer is provided on the sidewalls of the base trench to form a collector structure in contact with the collector layer and an emitter structure in contact with the emitter layer. A base structure of a compound semiconductive material is formed in the base trench. Connections are provided through an interlevel dielectric layer to the collector layer, emitter layer, and base structure. The base structure preferably is a material of silicon and at least one of silicon-germanium, silicon-germanium-carbon, and combinations thereof.

This method improves the response time of the lateral HBT and minimizes base resistance. Additionally, the HBT and manufacturing method of the present invention avoid the necessity of forming deep trench isolations and buried layers thereby reducing the expense of manufacturing the HBT.

Certain embodiments of the present invention have other advantages in addition to or in place of those mentioned above. The advantages will become apparent to those skilled in the art from a reading of the following detailed description when taken with reference to the accompanying drawings.

DETAILED DESCRIPTION OF THE INVENTION

In the following description, numerous specific details are given to provide a thorough understanding of the invention. However, it will be apparent to one skilled in the art that the invention may be practiced without these specific details. In order to avoid obscuring the present invention, some well-known system configurations, and process steps are not disclosed in detail.

Likewise, the drawings showing embodiments of the apparatus are semi-diagrammatic and not to scale and, particularly, some of the dimensions are for the clarity of presentation and are shown greatly exaggerated in the FIGs. Generally, the device can be operated in any orientation.

The term "horizontal" as used in herein is defined as a plane parallel to the conventional plane or surface of a wafer or substrate, regardless of its orientation. The term "vertical" refers to a direction perpendicular to the horizontal as just defined. Terms, such as "on", "above", "below", "side" (as in "sidewall"), "higher", "lower", "over", and "under", are defined with respect to the horizontal plane. The term "beside" refers to two structures, which are side by side with neither overlapping the other.

The term "processing", or "processed" as used herein includes deposition of material or photoresist, patterning, exposure, development, etching, cleaning, and/or removal of the material or photoresist as required in forming a described structure.

The term "conductivity type" as used herein refers to a semiconductive material that uses either electrons as the primary carrier of electrical charge, on one hand, or holes as the primary carrier of electrical charge, on the other hand.

Figure 1:
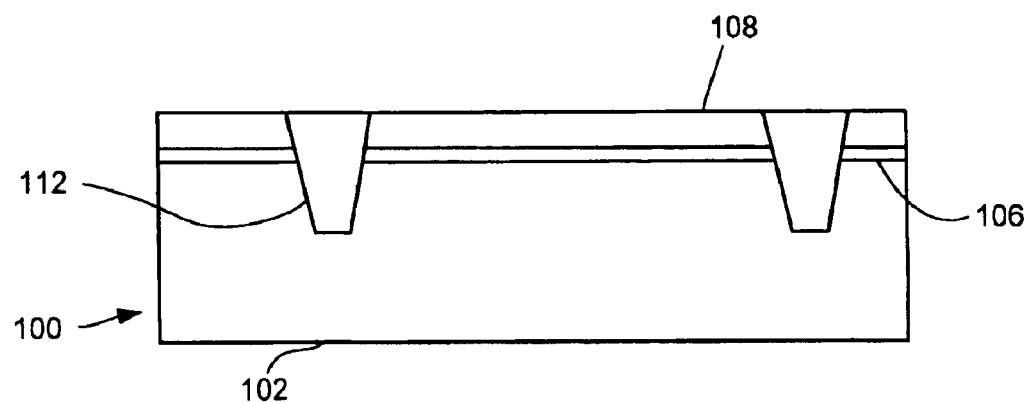
FIG. 1 is a lateral HBT having a first and a second insulating layer in an interim stage of manufacture in accordance with the present invention.

Referring now to FIG. 1, therein is shown a lateral HBT 100 in an interim stage of manufacture in accordance with the present invention. The lateral HBT 100 includes a semiconductor substrate 102, such as a lightly doped semiconductive material of a first conductivity type, such as p⁻ doped silicon. A first insulating layer 106, such as an oxide layer, is formed over the semiconductor substrate 102.

A second insulating layer 108, such as a nitride layer of a silicon nitride (SiN) compound, is formed over the first insulating layer 106. A number of shallow trench isolations (STIs) 112 are formed in the semiconductor substrate 102. Trenches are formed through the first insulating layer 106 and the second insulating layer 108 into the semiconductor substrate 102. The trenches then are filled with an insulating material, such as an oxide, to form the number of shallow trench isolations (STIs) 112. The upper surface is then processed using a chemical mechanical polish (CMP) process which stops on the second insulating layer 108 so that the upper surfaces of the number of STIs 112 are coplanar with the upper surface of the second insulating layer 108.

Figure 2:
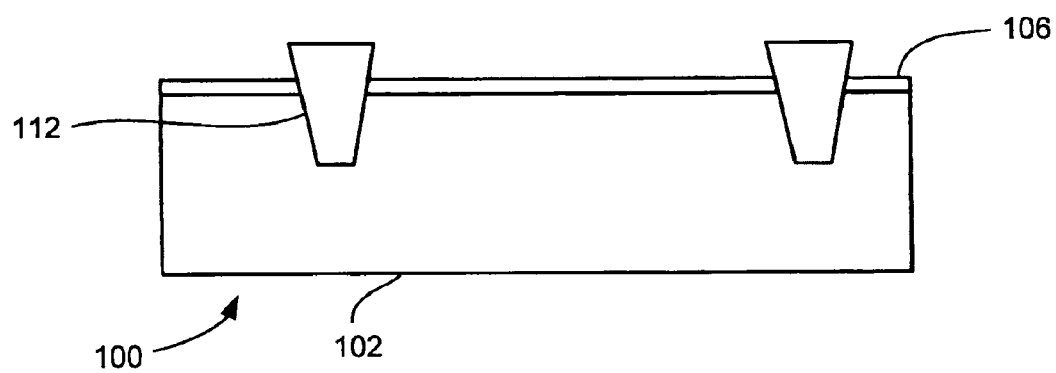
FIG. 2 is the structure of FIG. 1 after removal of the second insulating layer.

Referring now to FIG. 2, therein is shown the structure of FIG. 1 wherein the second insulating layer 108 has been removed. The second insulating layer 108 shown in FIG. 1 has been removed, for example, by an etching process that stops on the first insulating layer 106 so the number of STIs 112 are elevated above the first insulating layer 106. For example, if the first insulating layer 106 is an oxide layer and the second insulating layer 108 is a nitride layer, an etchant is used which selectively etches only the nitride layer leaving the oxide layer unetched.

Figure 3:
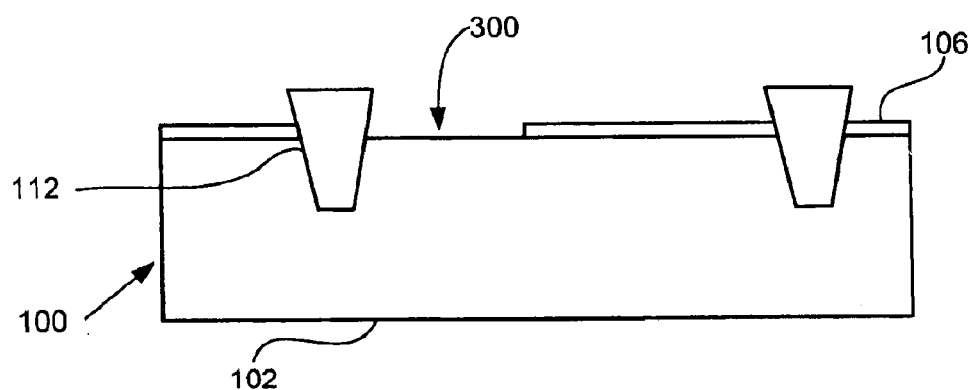
FIG. 3 is the structure of FIG. 2 after formation of a window in the first insulating to layer.

Referring now to FIG. 3, therein is shown the structure of FIG. 2 after formation of a window 300 in the first insulating layer 106. The window 300 is formed, for example, by using photolithographic processes to define an area of the first insulating layer 106 over a portion of the semiconductor substrate 102, and then etching that area of the first insulating layer 106 to form the window 300 over a portion of the semiconductor substrate 102.

Figure 4:
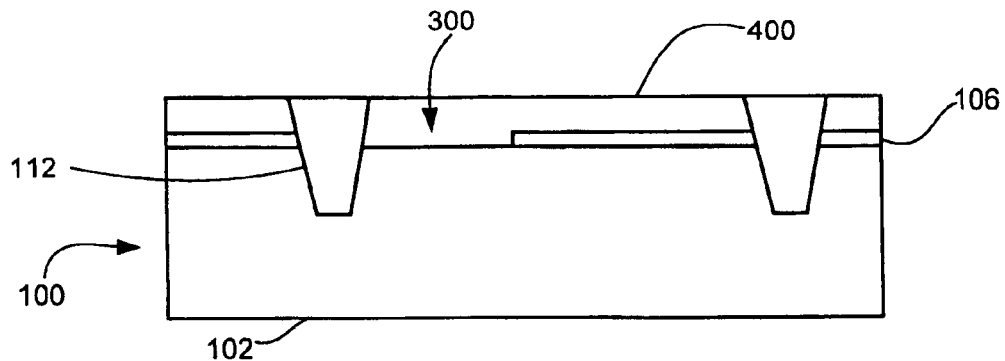
FIG. 4 is the structure of FIG. 3 after formation of an epitaxial silicon layer.

Referring now to FIG. 4, therein is shown the structure of FIG. 3 after formation of a first silicon layer 400, such as a heavily doped semiconductive material of the second conductivity type, such as n+ doped silicon. The first silicon layer 400 may be either epitaxially grown or formed by means of a chemical vapor deposition (CVD), and then processed further using CMP so the upper surface of the first silicon layer 400 is coplanar with the upper surfaces of the number of STIs 112. The first silicon layer 400 will be monocrystaline silicon in the area of the window 300 and polysilicon in the area over the first insulating layer 106.

Figure 5:
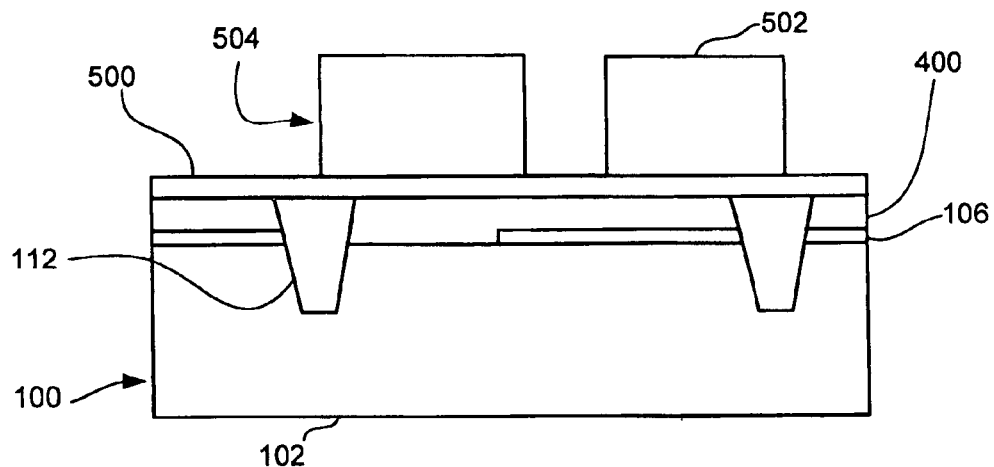
FIG. 5 is the structure of FIG. 4 after formation of a third insulating layer.

Referring now to FIG. 5, therein is shown the structure of FIG. 4 after formation of a third insulating layer 500, such as an oxide layer. The third insulating layer 500 is formed or grown over the first epitaxial silicon layer 400. A photoresist layer 502 is deposited and patterned to create a base trench mask 504.

Figure 6:
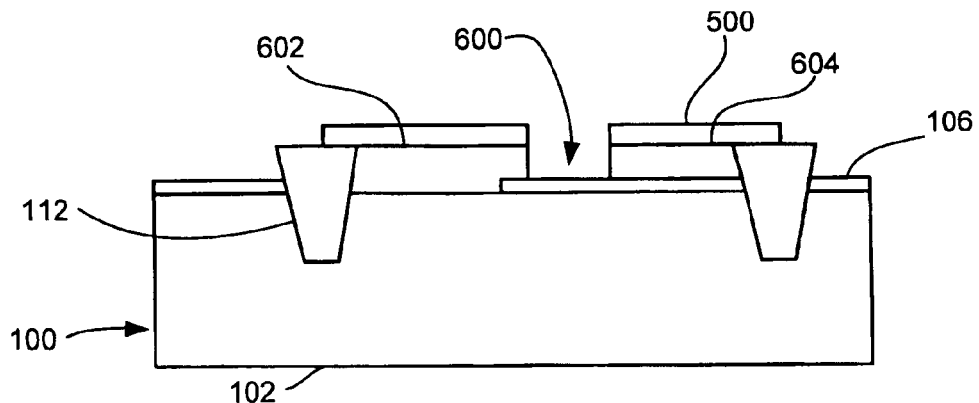
FIG. 6 is the structure of FIG. 5 after formation of a base trench.

Referring now to FIG. 6, therein is shown the structure of FIG. 5 after formation of a base trench 600. The third insulating layer 500 and the first silicon layer 400 are etched down to the first insulating layer 106 using the base trench mask 504 shown in FIG. 5. This exposes the number of STIs 112 and the first insulating layer 106. More particularly, the etching forms the base trench 600. The base trench 600 separates the combination of the third insulating layer 500 and the first silicon layer 400 into two portions. The portion of the first silicon layer 400 shown in FIG. 5 in contact with the semiconductor substrate 102 forms a collector layer 602. The portion of the first silicon layer 400 shown in FIG. 5 over the first insulating layer 106 forms an emitter layer 604. The base trench mask 504 is then removed.

Figure 7:
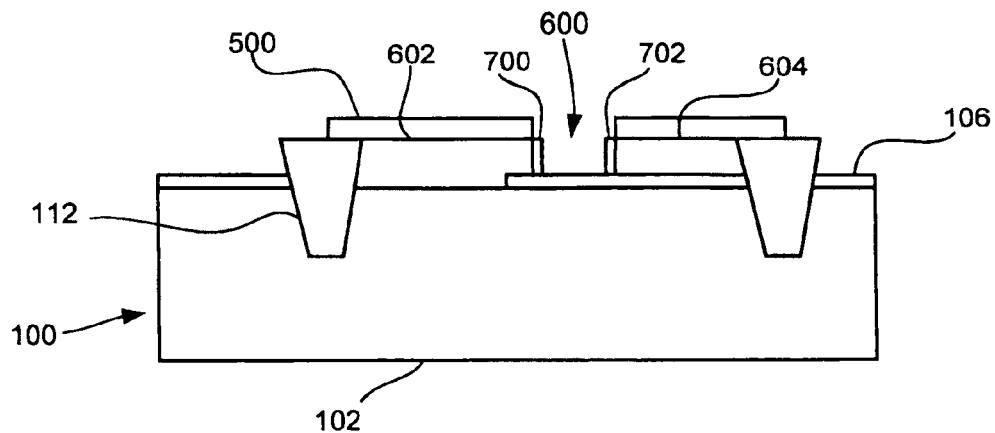
FIG. 7 is the structure of FIG. 6 after formation of a collector structure and an emitter structure.

Referring now to FIG. 7, therein is shown the structure of FIG. 6 after forming a collector structure 700 laterally on the collector layer 602 and an emitter structure 702 laterally on the emitter layer 604. The collector structure 700 and the emitter structure 702 preferably are formed by selective epitaxial growth of a second silicon layer, such as a lightly doped semiconductive material of the second conductivity type, such as n⁻ doped silicon. The second silicon layer can be lightly predoped during formation of the second silicon layer. The second silicon layer is formed only on the sidewalls of the base trench 600 and not on the first insulating layer 106 or the third insulating layer 500, thus forming the collector structure 700 and the emitter structure 702 on the sidewalls of the base trench 600.

Alternatively, formation of the collector structure 700 and the emitter structure 702 can be avoided by forming the collector layer 602 and the emitter layer 604 by selective epitaxy. The collector layer 602 and the emitter layer 604 can be selectively grown in their respective regions. The collector layer 602 can be selectively grown over the semiconductor substrate 102, and the emitter layer 604 can be selectively deposited over the first insulating layer 106.

Figure 8:
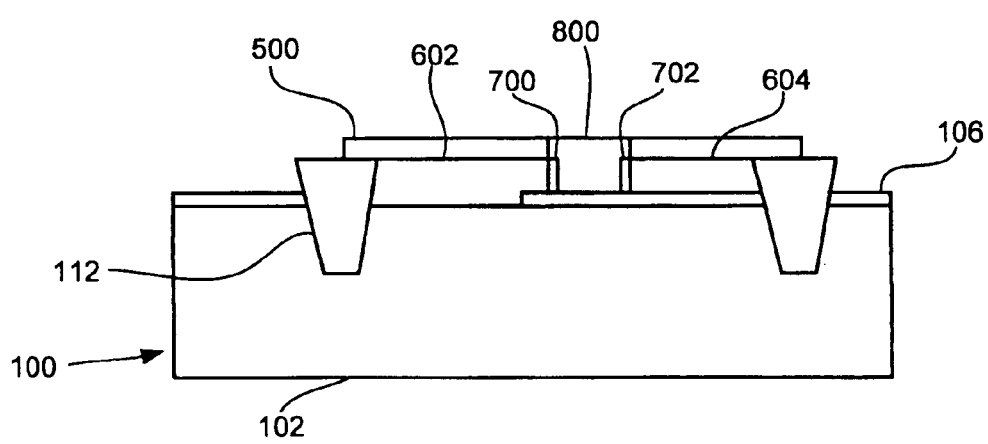
FIG. 8 is the structure of FIG. 7 after formation of a base structure.

Referring now to FIG. 8, therein is shown the structure of FIG. 7 after deposition and processing of a compound semiconductive layer to form a base structure 800 over the collector structure 700 and the emitter structure 702 in the base trench 600. The compound semiconductive layer forming the base structure 800 preferably is silicon (Si) and at least one of silicon germanium (SiGe), silicon germanium carbon (SiGeC), and combinations thereof. The base structure 800 fills the base trench 600 shown in FIG. 6 and FIG. 7 and is processed so the top surface of the base structure 800 is substantially coplanar with the top surface of the third insulating layer 500.

Figure 9:
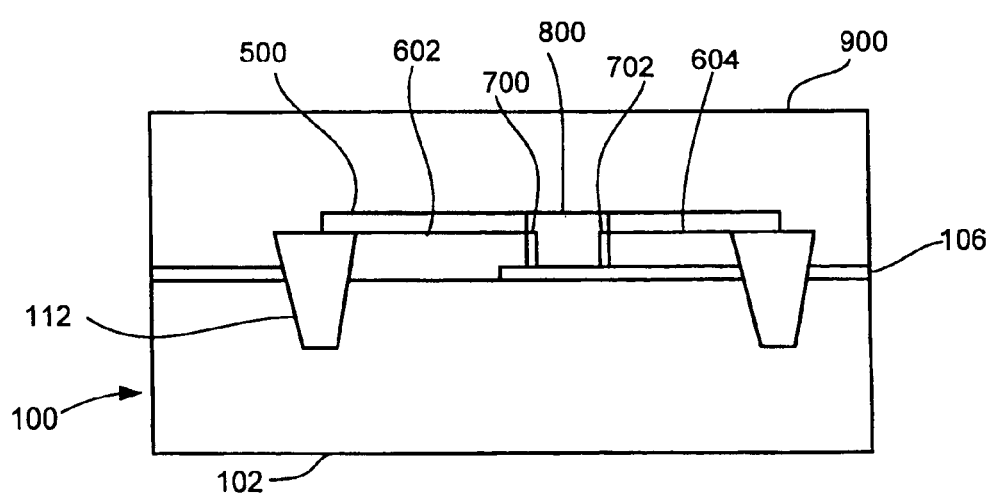
FIG. 9 is the structure of FIG. 8 after formation of an interlevel dielectric layer.

Referring now to FIG. 9, therein is shown the structure of FIG. 8 after formation of an interlevel dielectric (ILD) layer 900, such as an oxide layer, which is planarized using a CMP process.

Figure 10:
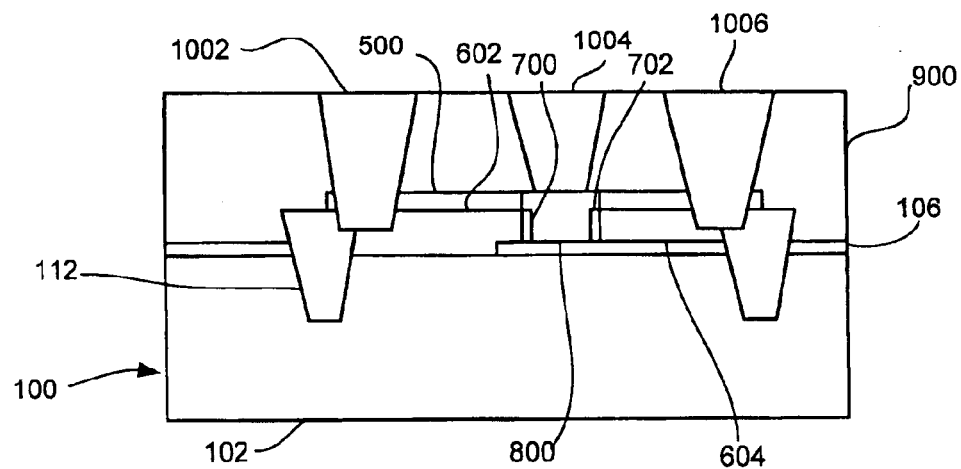
FIG. 10 is the structure of FIG. 9 after formation of a number of contacts.

Referring now to FIG. 10, therein is shown the structure of FIG. 9 after formation of the contacts of the lateral HBT 100. The lateral HBT 100 has a collector contact 1002, a base contact 1004, and an emitter contact 1006 formed in the ILD layer 900. The collector contact 1002 is formed by providing a hole through the ILD layer 900 and the third insulating layer 500 into the collector layer 602. The base contact 1004 is formed by providing a hole through the ILD layer 900 into the base structure 800. The emitter contact 1006 is formed by providing a hole through the ILD layer 900, and the third insulating layer 500 into the emitter layer 604. The collector contact 1002, the base contact 1004, and the emitter contact 1006 comprise a conductive material, such as tungsten (W) formed into the trenches.

Figure 11:
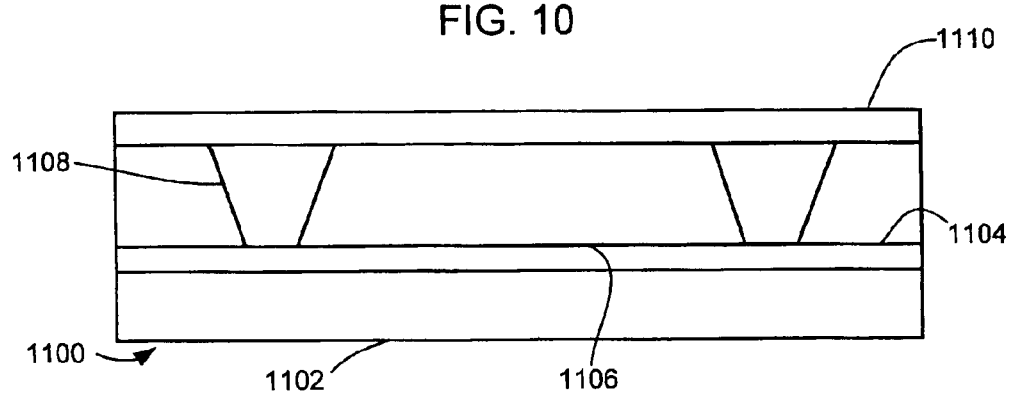
FIG. 11 is an alternate embodiment of the present invention in an interim stage of manufacture.

Referring now to FIG. 11, therein is shown an alternate embodiment of the present invention in an interim stage of manufacture using a silicon-on-insulator (SOI) wafer. A lateral HBT 1100 includes a semiconductor substrate 1102, such as a lightly doped semiconductive material of a first conductivity type, such as p⁻ doped silicon, that has an insulating layer 1104, such as an oxide layer, on the top thereof. A first silicon layer 1106, such as a heavily doped semiconductive material of a second conductivity type, such as n⁺ doped silicon, is then formed on the insulating layer 1104.

A number of STI's 1108 is formed in the first silicon layer 1106 in a conventional manner. A second insulating layer 1110, such as an oxide layer, is then formed over the number of STIs 1108 and the first silicon layer 1106. A CMP is performed to planarize the upper surface of the second insulating layer 1110.

Figure 12:
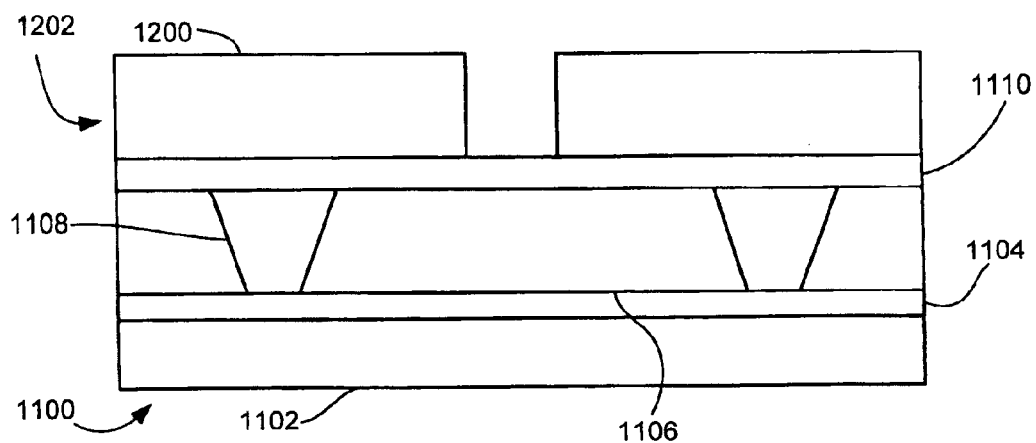
FIG. 12 is the structure of FIG. 11 after patterning an insulating layer.

Referring now to FIG. 12, therein is shown the structure of FIG. 11 wherein a photoresist layer 1200 has been deposited and patterned to form a base trench mask 1202 over the second insulating layer 1110.

Figure 13:
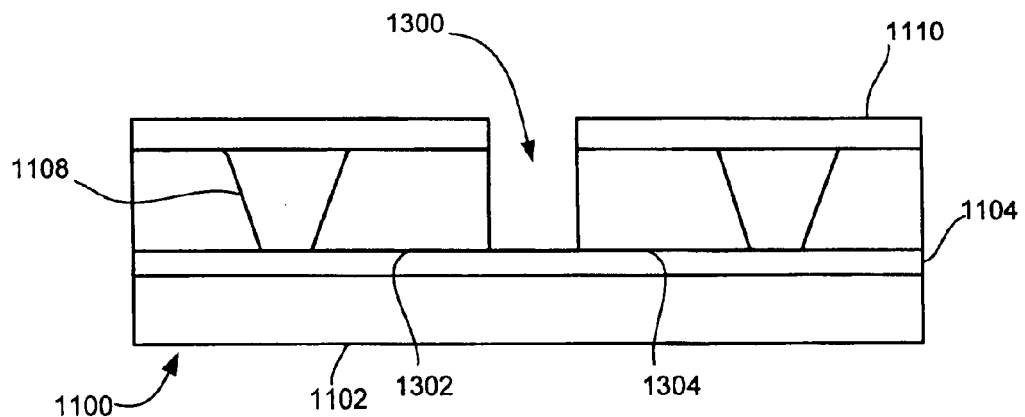
FIG. 13 is the structure of FIG. 12 after formation of a base trench.

Referring now to FIG. 13, therein is shown the structure of FIG. 12 after formation of a base trench 1300. The base trench 1300 is formed by etching the second insulating layer 1110 and the first silicon layer 1106 of FIG. 12 using the base trench mask 1202 of FIG. 12. The base trench 1300 separates the combination of the second insulating layer 1110 and the first silicon layer 1106 of FIG. 12 into two portions.

In this embodiment, the two portions are the same so either can be the collector portion or the emitter portion. For convenience of terminology, the portion of the first silicon layer 1106 on the left of FIG. 13 is designated as a collector layer 1302 and the portion of the first silicon layer 1106 on the right of FIG. 13 is designated as an emitter layer 1304. The photoresist layer 1200 shown in FIG. 12 is then removed leaving the remainder of the two portions of the second insulating layer 1110 on the upper surface of the structure.

Figure 14:
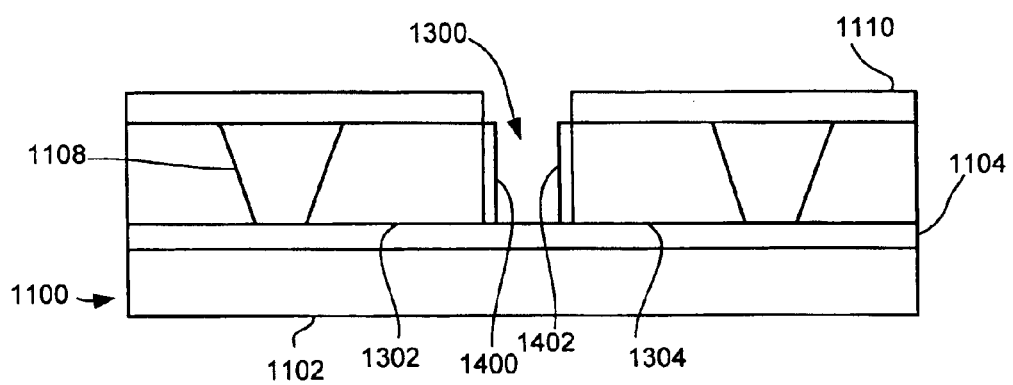
FIG. 14 is the structure of FIG. 13 after formation of a collector structure and an emitter structure.

Referring now to FIG. 14, therein is shown the structure of FIG. 13 after formation of a collector structure 1400 laterally on the collector layer 1302 and an emitter structure 1402 laterally on the emitter layer 1304. The collector structure 1400 and the emitter structure 1402 are formed by selective epitaxial growth of a lightly doped semiconductive material of the second conductivity type, such as an n doped silicon.

Figure 15:
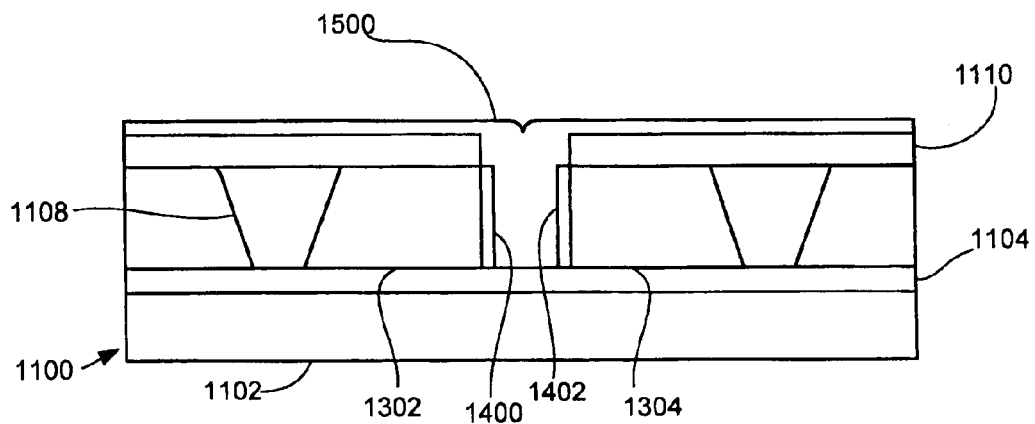
FIG. 15 is the structure of FIG. 14 after filling the base trench with a compound semiconductive material.

Referring now to FIG. 15, therein is shown the structure of FIG. 14 after the base trench 1300 is filled with a compound semiconductive layer 1500. The compound semiconductive layer 1500 preferably comprises silicon (Si) and at least one of silicon-germanium (SiGe), silicon-germanium-carbon (SiGeC), and combinations thereof.

Figure 16:
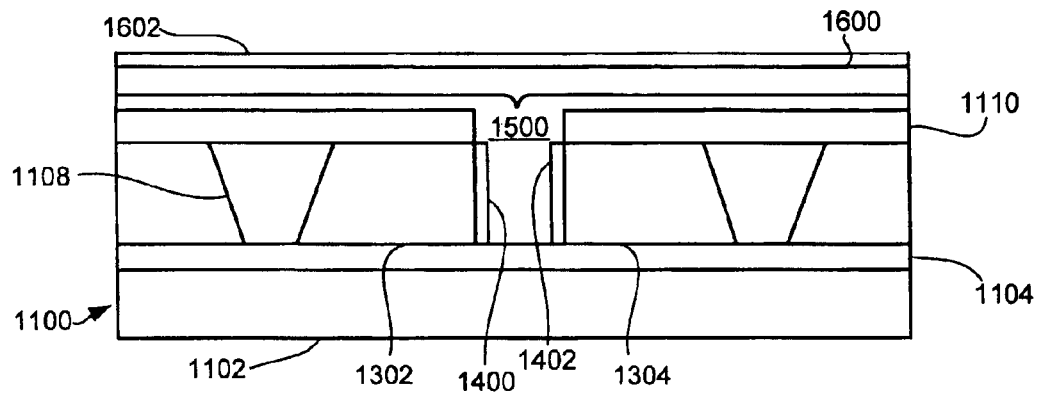
FIG. 16 is the structure of FIG. 15 after formation of a base connector layer.

Referring now to FIG. 16, therein is shown the structure of FIG. 15 after deposition of a base connector layer 1600 and a third insulating layer 1602. The base connector layer 1600 is formed over the compound semiconductive layer 1500 used to fill the base trench 1300, such as by depositing a layer of a heavily doped semiconductive material of the first conductivity type, such as p⁺ doped polysilicon. The third insulating layer 1602, such as a nitride layer, is then formed over the base connector layer 1600.

Figure 17:
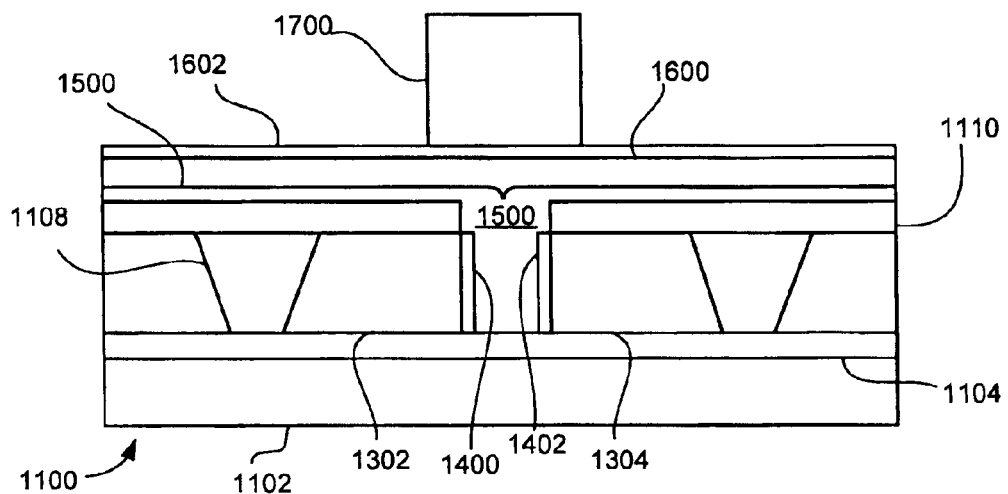
FIG. 17 is the structure of FIG. 16 after patterning the base contact layer.

Referring now to FIG. 17, therein is shown the structure of FIG. 16 after a photoresist layer 1700 has been deposited and processed. The photoresist layer 1700 defines an area over the base trench 1300 shown in FIG. 14, which has been filled by the collector structure 1400, the emitter structure 1402, and the compound semiconductive layer 1500.

Figure 18:
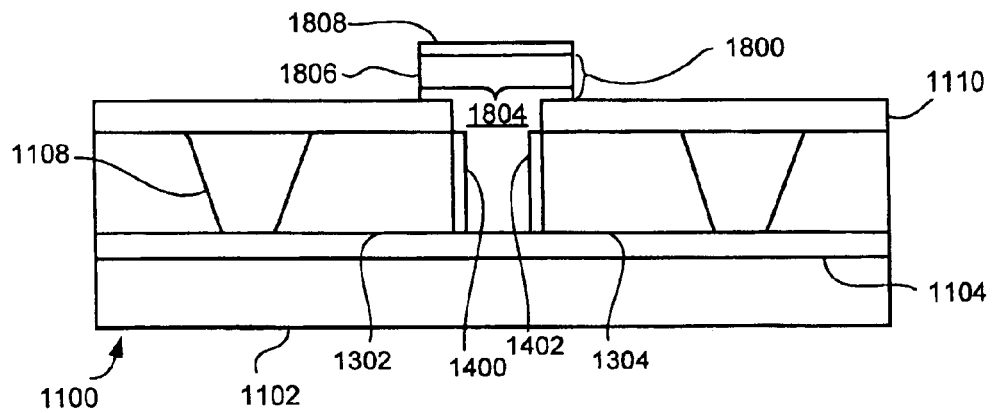
FIG. 18 is the structure of FIG. 17 after formation of a base structure.

Referring now to FIG. 18, therein is shown the structure of FIG. 17 after formation of a base structure 1800. The third insulating layer 1602, the base connector layer 1600, and the compound semiconductive layer 1500, all shown in FIG. 17, are etched using the photoresist layer 1700 of FIG. 17. The base structure 1800 comprises a base layer 1804 formed from the compound semiconductive layer 1500 and a base connector 1806 formed from the base connector layer 1600. An insulating cap 1808 is formed over the base structure 1800 from the third insulating layer 1602.

Figure 19:
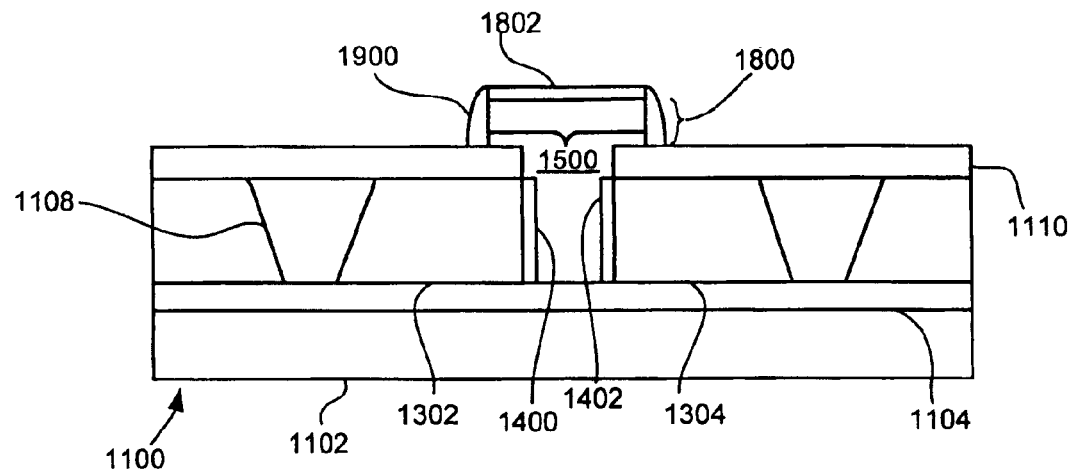
FIG. 19 is the structure of FIG. 18 after formation of an insulating spacer around the base structure.

Referring now to FIG. 19, therein is shown the structure of FIG. 18 after formation of an insulating spacer 1900, such as a nitride spacer. The insulating spacer 1900 is formed around the base structure 1800, such as by depositing a layer of insulating material, such as nitride, and then etching the layer of insulating material to form the insulating spacer 1900.

Figure 20:
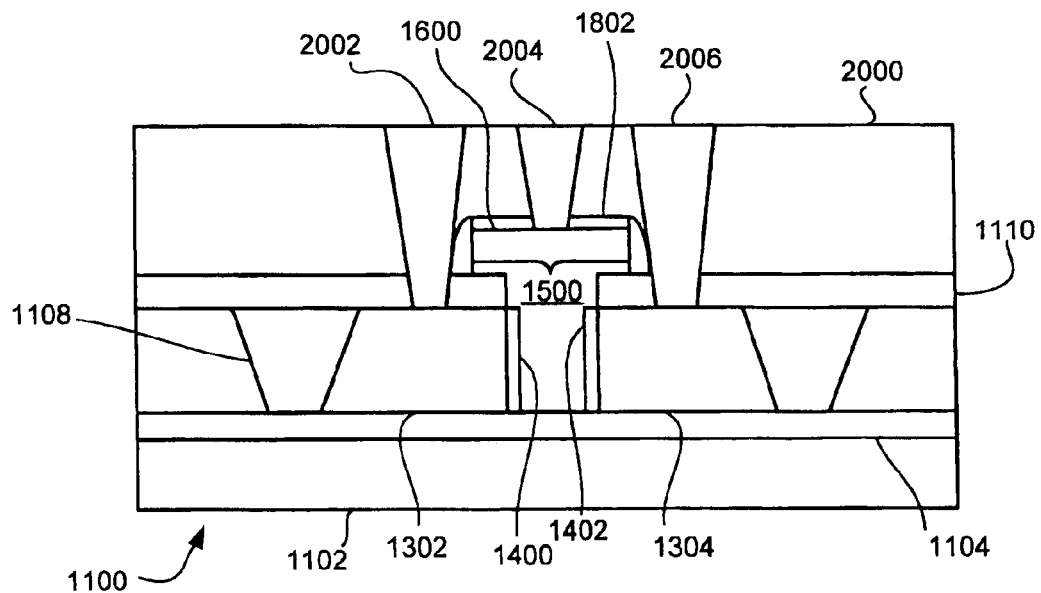
FIG. 20 is the structure of FIG. 20 after formation of contacts in an interlevel dielectric layer.

Referring now to FIG. 20, therein is shown the structure of FIG. 19 after formation of the various contacts for the lateral HBT 1100. The contacts are formed by providing an ILD layer 2000, which is formed for example, by depositing an insulating material, such as oxide, and then performing a CMP process to planarize the upper surface of the ILD layer 2000. The ILD layer 2000 is then processed to form holes that are filled with a conductive material, such as tungsten (W), to provide the various contacts of the lateral HBT 1100.

A collector contact 2002 is formed by filling a hole through the ILD layer 2000 that comes into contact with the collector layer 1302. A base contact 2004 is formed by filling a hole through the ILD layer 2000 and the insulating cap 1808 to the base structure 1800. An emitter contact 2006 is formed by filling a hole through the ILD layer 2000 into contact with the emitter layer 1304. The collector contact 2002 and the emitter contact 2006 are on opposite sides of the base structure 1800. The insulating cap 1808 and the insulating spacer 1900 are used in this device to enable use of standard self-aligned contact processing techniques thereby further reducing the size of the lateral HBT 1100.

Figure 21:
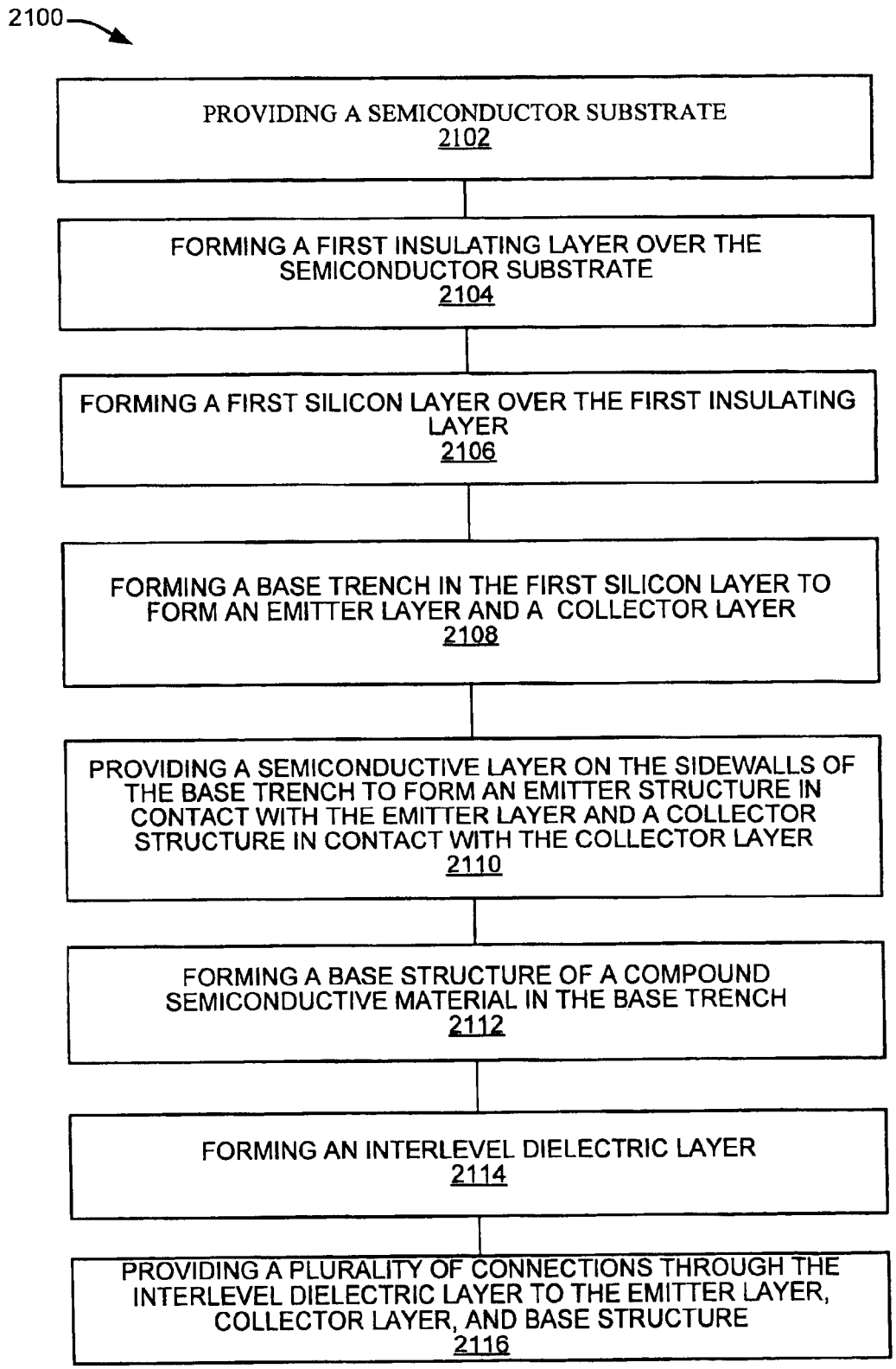
FIG. 21 is a flow chart of the method of the present invention.

Referring now to FIG. 21 therein is shown a flow diagram of a method 2100 of the present invention. The method 2100 comprises a block 2102 of providing a semiconductor substrate; a block 2104 of forming a first insulating layer over the semiconductor substrate; a block 2106 of forming a first silicon layer over the first insulating layer; a block 2108 of forming a base trench in the first silicon layer to form an emitter layer and a collector layer; a block 2110 of providing a semiconductive layer on the sidewalls of the base trench to form an emitter structure in contact with the emitter layer and a collector structure in contact with the collector layer; a block 2112 of forming a base structure of a compound semiconductive material in the base trench; a block 2114 of forming an interlevel dielectric layer; and a block 2116 of providing a plurality of connections through the interlevel dielectric layer to the emitter layer, collector layer, and base structure.

While the invention has been described in conjunction with specific best modes, it is to be understood that many alternatives, modifications, and variations will be apparent to those skilled in the art in light of the foregoing description. Accordingly, it is intended to embrace all such alternatives, modifications, and variations, which fall within the spirit and scope of the included claims. All matters set forth herein or shown in the accompanying drawings are to be interpreted in an illustrative and non-limiting sense.

What is claimed is:

1. A method of manufacturing a lateral heterojunction bipolar transistor comprising:
   providing a semiconductor substrate;
   forming a first insulating layer over the semiconductor substrate;
   forming a first silicon layer over the first insulating layer;
   forming a base trench in the first silicon layer to form a collector layer and an emitter layer;
   providing a semiconductive layer on the sidewalls of the base trench to form an emitter structure in contact with the emitter layer and a collector structure in contact with the collector layer;
   forming a base structure of a compound semiconductive material in the base trench;
   forming an interlevel dielectric layer; and
   providing a plurality of connections through the interlevel dielectric layer to the collector layer, emitter layer, and base structure.

2. The hod of manufacturing a lateral heterojunction bipolar transistor as claimed in claim 1 wherein forming a base structure in the base trench forms a compound semiconductive material of silicon and at least one of silicon-germanium, silicon-germanium-carbon, and combinations thereof.

3. The method of manufacturing a lateral heterojunction bipolar transistor as claimed in claim 1 wherein:
   form the first silicon layer forms a heavily doped semiconductive material of the second conductivity type; and
   providing a semiconductive layer on the sidewalls of the base trench provides a lightly doped semiconductive material of the second conductivity type.

4. The method of manufacturing a lateral heterojunction bipolar transistor as claimed in claim 1 wherein:
   forming a first insulating layer over the semiconductor substrate further comprises:
   forming a window in the first insulating layer to expose a portion of the semiconductor substrate; and
   forming a base trench in the first silicon layer to form an emitter layer and a collector layer forms an emitter layer over the first insulating layer and a collector layer over the exposed portion of to semiconductor substrate.

5. The method of manufacturing a lateral heterojunction bipolar transistor as claimed in claim 4 wherein foaming a base structure in the base trench forms a material of silicon and at least one of silicon-germanium, silicon-germanium-carbon, and combinations thereof.

6. A method of manufacturing a lateral heterojunction bipolar transistor comprising:
   providing a semiconductor substrate of a first conductivity type;
   forming a first insulating layer over the semiconductor substrate;
   forming a first silicon layer of a second conductivity type over the first insulating layer;
   forming a base trench in the first silicon layer to form a collector layer and an emitter layer,
   forming a silicon spacer of the second conductivity type on the sidewalls of the base trench to form a collector structure and an emitter structure;
   forming a base structure of a compound semiconductive material in the base trench;
   forming an interlevel dielectric layer, and
   providing a plurality of connections through the interlevel dielectric layer to the collector layer, the emitter layer, and the base structure.

7. The method of manufacturing a lateral heterojunction bipolar transistor as claimed in claim 6 wherein forming the base structure in the base trench forms a compound semiconductive material of silicon and at least one of silicon-germanium, silicon-germanium-carbon, and combinations thereof.

8. The method of manufacturing a lateral heterojunction bipolar transistor as claimed in claim 6 wherein:
   providing the semiconductor substrate provides a lightly doped semiconductive material of a first conductivity type;
   forming the first silicon layer deposits a heavily doped semiconductive material of the second conductivity type; and
   providing a semiconductive layer on the sidewalls of the base trench provides a lightly doped semiconductive material of the second conductivity type.

9. The method of manufacturing a lateral heterojunction bipolar transistor as claimed in claim 6 further comprising:
   forming a window in the first insulating layer to expose a portion of the semiconductor substrate; and
   forming a base trench in the first silicon layer to form a collector layer and an emitter layer forms a collector layer over the exposed portion of the semiconductor substrate and an emitter layer over the first insulating layer.

10. The method of manufacturing a lateral heterojunction bipolar transistor as claimed in claim 9 wherein forming a base structure in the base trench forms a material of silicon and at least one of silicon-germanium, silicon-germanium-carbon, and combinations thereof.

* * * * *

UNITED STATES PATENT AND TRADEMARK OFFICE
CERTIFICATE OF CORRECTION

PATENT NO. : 6,908,824 B2
DATED : June 21, 2005
INVENTOR(S) : Li et al.

It is certified that error appears in the above-identified patent and that said Letters Patent is hereby corrected as shown below:

Column 3,
Line 18, delete "semiconductive 1o" and insert therefor -- semiconductive --.
Line 26, delete "the is" and insert therefor -- the --.

Column 4,
Line 48, delete "insulating to" and insert therefor -- insulating --.
Lines 60 and 66, delete "layer," and insert therefor -- layer; --.

Column 5,
Lines 10 and 16, delete "layer," and insert therefor -- layer; --.

Column 9,
Line 61, delete "The hod" and insert therefor -- The method --.

Column 4,
Line 3, delete "form" and insert therefor -- forming --.
Line 18, delete "of to" and insert therefor -- of the --.
Line 20, delete "foaming" and insert therefor -- forming --.
Lines 33 and 39, delete "layer," and insert therefor -- layer; --.

Signed and Sealed this

Thirtieth Day of August, 2005

JON W. DUDAS
*Director of the United States Patent and Trademark Office*